(12) United States Patent
Huang et al.

(10) Patent No.: US 12,019,370 B2
(45) Date of Patent: Jun. 25, 2024

(54) METHOD AND SYSTEM FOR MANUFACTURING A SEMICONDUCTOR DEVICE

(71) Applicant: TAIWAN SEMICONDUCTOR MANUFACTURING COMPANY, LTD., Hsinchu (TW)

(72) Inventors: Wei-Han Huang, Taichung (TW); Hao Yuan Chang, Miaoli County (TW); Yao-Hwan Kao, Baoshan Shiang (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1 day.

(21) Appl. No.: 17/462,943

(22) Filed: Aug. 31, 2021

(65) Prior Publication Data

US 2023/0062148 A1 Mar. 2, 2023

(51) Int. Cl.
*G03F 7/00* (2006.01)
*G03F 7/16* (2006.01)
*G03F 7/32* (2006.01)

(52) U.S. Cl.
CPC .............. *G03F 7/0025* (2013.01); *G03F 7/32* (2013.01); *G03F 7/70933* (2013.01); *G03F 7/162* (2013.01)

(58) Field of Classification Search
CPC ...... G03F 7/0025; G03F 7/32; G03F 7/70933; G03F 7/162
See application file for complete search history.

(56) References Cited

U.S. PATENT DOCUMENTS

| | | | |
|---|---|---|---|
| 2002/0088952 A1* | 7/2002 | Rao | G01N 21/9501 250/559.45 |
| 2003/0084925 A1* | 5/2003 | Nakajima | B01F 23/29 134/28 |
| 2003/0172955 A1* | 9/2003 | Kuroda | H01L 21/67051 134/33 |

(Continued)

FOREIGN PATENT DOCUMENTS

KR     2011040659 A  *  4/2011  ............... G03F 7/32

OTHER PUBLICATIONS

Y. Hirota, I. Kanno, K. Fujiwara, H. Nagayasu and S. Shimose, "Damage-free wafer cleaning by water and gas mixture jet," ISSM 2005, IEEE International Symposium on Semiconductor Manufacturing, 2005., 2005, pp. 219-222, doi: 10.1109/ISSM.2005.1513340. (Year: 2005).*

(Continued)

*Primary Examiner* — Sean M DeGuire
*Assistant Examiner* — Alexander Nicholas Lee
(74) *Attorney, Agent, or Firm* — STUDEBAKER & BRACKETT PC

(57) ABSTRACT

A method for manufacturing a semiconductor device includes forming a photoresist layer comprising a photoresist composition over a substrate to form a photoresist-coated substrate. The photoresist layer is selectively exposed to actinic radiation to form a latent pattern in the photoresist layer. The latent pattern is developed by applying a developer to the selectively exposed photoresist layer to form a patterned photoresist layer exposing a portion of the substrate, and a purge gas is applied to the patterned photoresist layer.

20 Claims, 20 Drawing Sheets

(56) References Cited

U.S. PATENT DOCUMENTS

| | | | |
|---|---|---|---|
| 2005/0051196 A1* | 3/2005 | Kao | H01L 21/6715 |
| | | | 134/25.4 |
| 2005/0211267 A1* | 9/2005 | Kao | H01L 21/67028 |
| | | | 257/E21.228 |
| 2009/0162547 A1* | 6/2009 | Sawada | H01L 21/6715 |
| | | | 118/320 |
| 2014/0261569 A1* | 9/2014 | Fonseca | H01L 21/67051 |
| | | | 134/30 |
| 2016/0096203 A1* | 4/2016 | Kai | H01L 21/31133 |
| | | | 134/30 |
| 2016/0118241 A1* | 4/2016 | Lee | H01L 21/67051 |
| | | | 134/33 |
| 2019/0148134 A1* | 5/2019 | Emoto | H01L 21/67028 |
| | | | 427/372.2 |

OTHER PUBLICATIONS

Murthy S. Krishna, Emir Gurer, Ed C. Lee, Gary E. Flores, Sandra S. Ooka, John W. Salois, Royal Cherry, and Reese M. Reynolds "Reduction of postdevelop defects and process times for DUV lithography", Proc. SPIE 3677, Metrology, Inspection, and Process Control for Microlithography XIII, (Jun. 14, 1999) (Year: 1999).*

* cited by examiner

METHOD AND SYSTEM FOR MANUFACTURING A SEMICONDUCTOR DEVICE

BACKGROUND

During an integrated circuit (IC) design, a number of patterns of the IC, for different steps of IC processing, are generated on a substrate. The patterns may be produced by projecting, e.g., imaging, layout patterns of a mask on a photo resist layer of the wafer. A lithographic process transfers the layout patterns of the masks to the photo resist layer of the wafer such that etching, implantation, or other steps are applied only to predefined regions of the wafer. It is desirable that the layout patterns are produced on the substrate without error such that etching produces no defects on the substrate.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
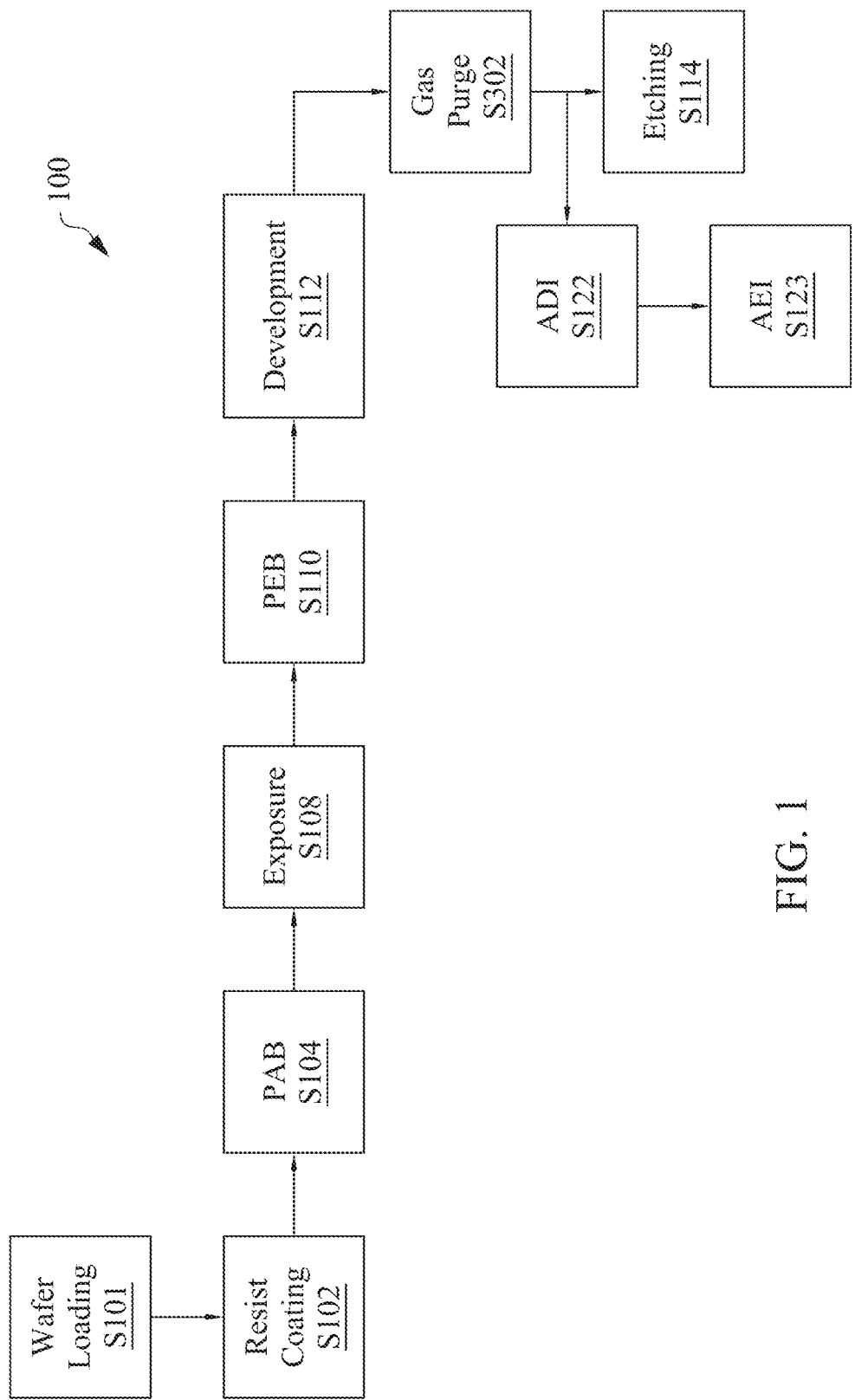
FIG. 1 shows a process flow for generating an etched pattern on a semiconductor substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

Figure 2:
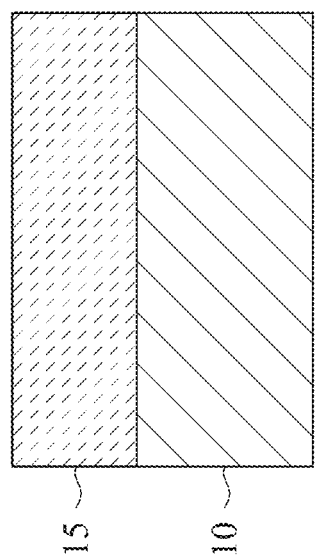
FIG. 2 shows a process stage of a sequential operation according to an embodiment of the disclosure.

FIG. 1 shows a process 100 for manufacturing a semiconductor device according to embodiments of the disclosure. In some embodiments, the process 100 is performed by a lithography system that is controlled by the control system 700 of FIG. 11 and/or the computer system 900 of FIGS. 13A and 13B. In a wafer loading operation S101, a substrate 10, e.g., a wafer, is loaded into a semiconductor device processing tool. In some embodiments, the tool is a coater developer tool (not shown). In some embodiments, in a resist coating operation S102, a resist layer 15 of a resist material is disposed, e.g., coated, on a top surface of a substrate 10, e.g., the wafer or a work piece. As shown in FIG. 2, a photoresist layer 15 is disposed over a semiconductor substrate 10, such as a wafer. In some embodiments, the photoresist is applied using a process such as a spin-on coating process, a dip coating method, an air-knife coating method, a curtain coating method, a wire-bar coating method, a gravure coating method, a lamination method, an extrusion coating method, combinations of these, or the like. In some embodiments, the photoresist layer 15 thickness ranges from about 10 nm to about 300 nm. At photoresist thicknesses below the disclosed range there may be insufficient photoresist coverage to protect the underlying substrate during subsequent etching operations. At photoresist thicknesses greater than the disclosed range, there may be excessive photoresist waste and longer processing times.

A pre-exposure (or post application bake (PAB)) is performed at a PAB operation S104 and the semiconductor substrate 10 including the photoresist layer 15 is baked to drive out solvent in the resist material and solidify the photoresist layer 15 on top of the semiconductor substrate 10. In some embodiments, the photoresist layer 15 is heated at a temperature of about 40° C. to about 120° C. for about 10 seconds to about 10 minutes, during PAB operation S104. In the present disclosure, the terms resist and photoresist are used interchangeably. At PAB times and temperatures below the disclosed range there may be insufficient removal of photoresist solvent. At PAB times and temperatures greater than the disclosed range, there may be increased energy costs and longer processing times.

Figure 3:
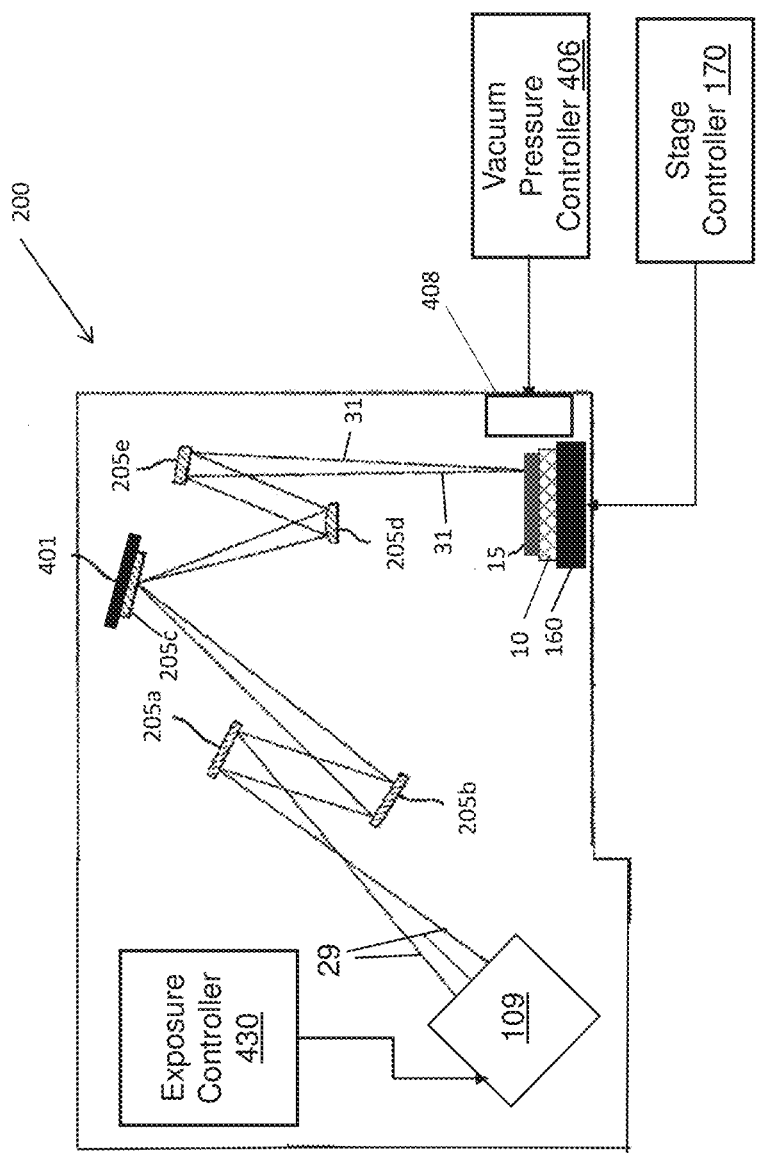
FIG. 3 shows a schematic view of an exposure device of a lithography system for generating a photo resist pattern on a wafer.

In an exposure operation S108, the photoresist-coated substrate is loaded into a photolithography tool 200, as shown in FIG. 3. The photoresist layer 15 is exposed to actinic radiation, in the photolithography tool. The exposure operation S108 also projects a layout pattern of the mask, using the actinic radiation from the radiation source, onto the photoresist layer 15 on the semiconductor substrate 10. In some embodiments, the photoresist layer 15 is selectively exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the radiation is an electron beam. In the present disclosure, the terms mask, photomask, and reticle are used interchangeably.

In some embodiments, the mask 205c is a reflective mask and the layout pattern on the mask is projected by extreme ultraviolet (EUV) radiation from an EUV light source 109 onto the photoresist layer 15 to generate a latent image in the photoresist layer 15 on the semiconductor substrate 10.

FIG. 3 shows a schematic view of a photolithography tool 200 for generating a resist pattern on a wafer. In some embodiments, the photolithography tool 200 is an extreme ultraviolet (EUV) lithography tool, where the photoresist layer 15 is exposed by a patterned beam 31 of EUV radiation. A chamber of the photolithography tool 200 may include a wafer movement device, e.g., a stage 160, a stepper, a scanner, a step and scan system, a direct write system, a device using a contact and/or proximity mask, etc. The tool is provided with one or more optics 205a, 205b, for example, to illuminate a patterning optics, such as a reticle, e.g., a reflective mask 205c with a radiation beam 29, e.g., an EUV radiation beam in some embodiments. The illumination of the patterning optics may produce a patterned beam 31. One or more reduction projection optics 205d, 205e, of the optical system projects the patterned beam 31 onto a photoresist layer 15 of the semiconductor substrate 10. A stage controller 170 may be coupled to the wafer movement device, e.g., the stage 160, for generating a controlled relative movement between the semiconductor substrate 10 and the patterning optics, e.g., the reflective mask 205c. By the controlled relative movement, different dice of the semiconductor substrate 10 are patterned. In some embodiments, the reflective mask 205c is mounted on a reticle stage 401, e.g., a mask stage.

As further shown, the photolithography tool 200 of FIG. 3 includes a radiation source 109 to generate the radiation beam 29 used to irradiate the reflective mask 205c. Because gas molecules absorb EUV light, the photolithography tool 200 is maintained under a vacuum environment to avoid EUV intensity loss. In addition, in some embodiments, the photolithography tool 200 includes an exposure controller 430 to control an intensity of the radiation beam 29. In some embodiments, the exposure controller 430 adjusts the intensity of the radiation by adjusting a projection time of the lithography operation to pattern the resist layer. In some embodiments, a pressure inside the photolithography tool 200 is sensed by a pressure sensor 408 inside the photolithography tool 200 and is controlled by a vacuum pressure controller 406 that is coupled to the photolithography tool 200.

Figure 4B:
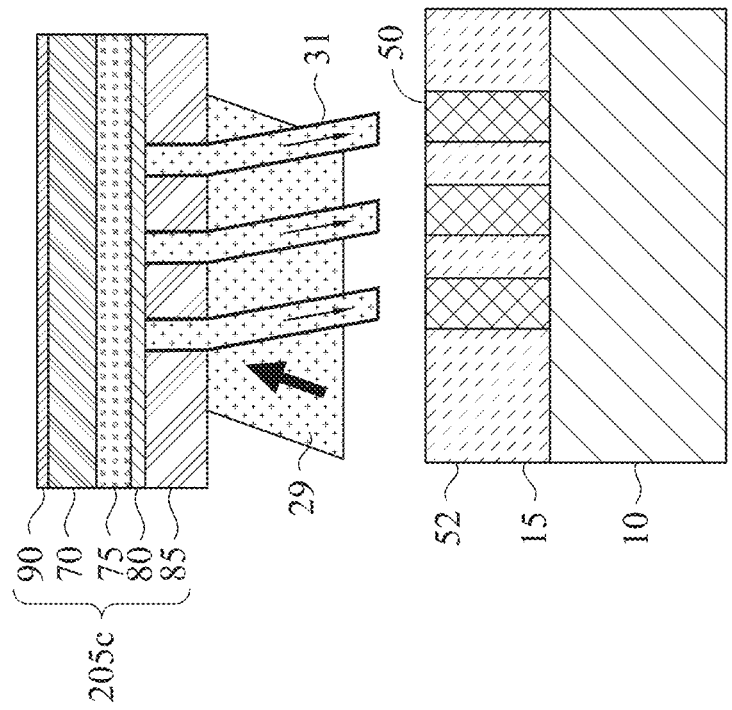
FIGS. 4A and 4B show a process stage of a sequential operation according to an embodiment of the disclosure.
Figure 4A:
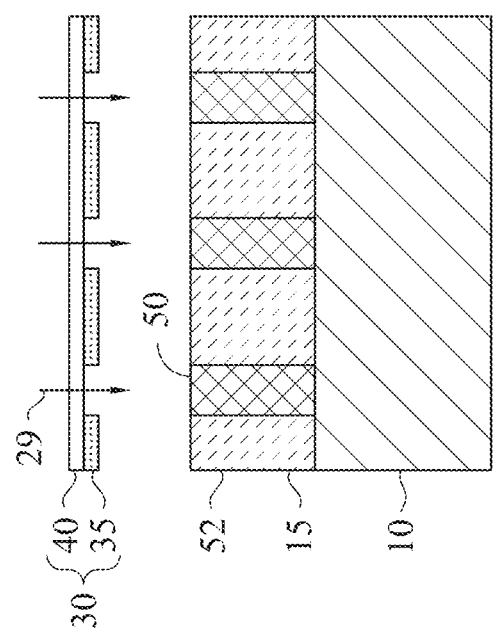

As shown in FIG. 4A, the exposure radiation beam 29 passes through a photomask 30 before irradiating the photoresist layer 15 in some embodiments. In some embodiments, the photomask has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

In some embodiments, where the exposure radiation is EUV radiation, a reflective photomask 205c is used to form the patterned exposure light, as shown in FIG. 4B. The reflective photomask 205c includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion glass substrate 70. In extreme ultraviolet lithography, extreme ultraviolet radiation beam 29 is directed towards the reflective photomask 205c at an incident angle of about 6°. A portion 31 of the extreme ultraviolet radiation is reflected by the Si/Mo multilayer 75 towards the photoresist-coated substrate 10, while the portion of the extreme ultraviolet radiation incident upon the absorber layer 85 is absorbed by the photomask. In some embodiments, additional optics, including mirrors, are between the reflective photomask 205c and the photoresist-coated substrate.

The exposed region 50 of the photoresist layer to radiation undergoes a chemical reaction thereby changing its solubility in a subsequently applied developer relative to the unexposed region 52 of the photoresist layer to radiation. In some embodiments, the exposed region 50 of the photoresist layer to radiation undergoes a reaction making the exposed portion more soluble in a developer. In other embodiments, the exposed region 50 of the photoresist layer to radiation undergoes a crosslinking reaction making the exposed portion less soluble in a developer.

In some embodiments, the actinic radiation beam 29, includes g-line (wavelength of about 436 nm), i-line (wavelength of about 365 nm), ultraviolet radiation, far ultraviolet radiation, extreme ultraviolet, electron beam, or the like. In some embodiments, the radiation source 109 is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm). In some embodiments, the exposure of the photoresist layer 15 uses an immersion lithography technique. In such a technique, an immersion medium is placed between the final optics and the photoresist layer, and the exposure radiation passes through the immersion medium.

A post exposure bake (PEB) is performed at a PEB operation S110 on the substrate where the resist layer is further baked after being exposed to the actinic radiation and before being developed in a development operation S112. In some embodiments, the photoresist layer 15 is heated to a temperature of about 50° C. and 160° C. for about 20 seconds to about 10 minutes. In some embodiments, the photoresist layer 15 is heated for about 30 seconds to about 5 minutes. In some embodiments, the photoresist layer 15 is heated for about 1 minute to about 2 minutes. The post-exposure baking may be used to assist in the generating, dispersing, and reacting of acid/base/free radical generated from the impingement of the actinic radiation upon the photoresist layer 15 during the exposure. Such assistance helps to create or enhance chemical reactions that generate chemical differences between the exposed region and the unexposed region within the photoresist layer. These chemical differences also cause differences in the solubility between the exposed region and the unexposed region. At PEB times and temperatures below the disclosed ranges there may be insufficient generation, dispersion, and reaction of the chemical reactants in the exposed region of the photoresist layer. At PEB times and temperatures greater than the disclosed ranges, there may be increased energy costs and longer processing times, and thermal degradation of the photoresist layer.

Figure 6A:
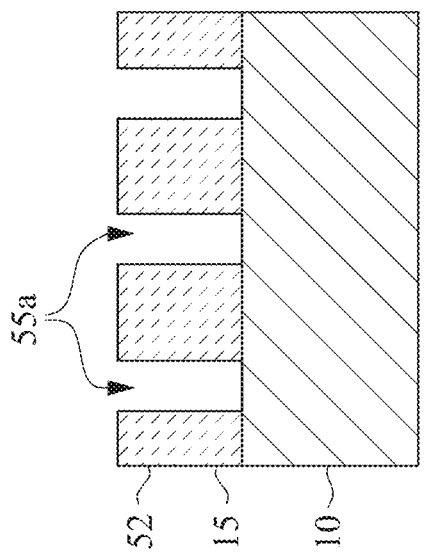
FIGS. 6A and 6B show a process stage of a sequential operation according to an embodiment of the disclosure.
Figure 6B:
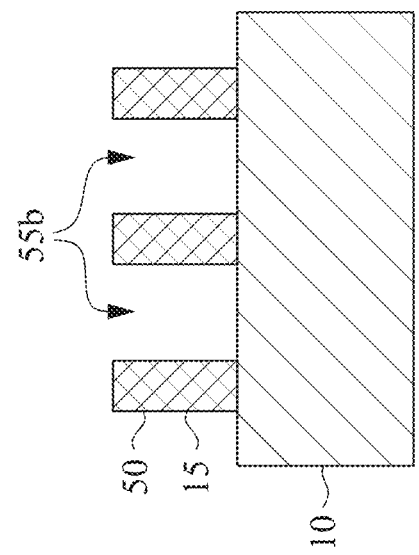
Figure 5:
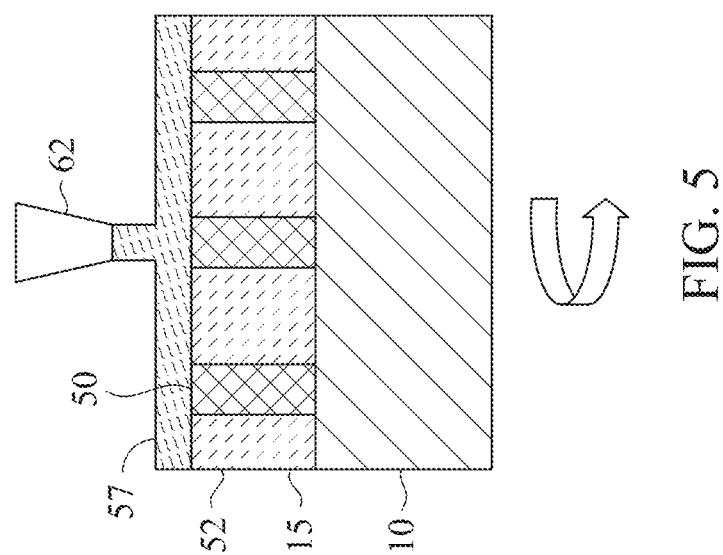
FIG. 5 shows a process stage of a sequential operation according to an embodiment of the disclosure.

The selectively exposed photoresist layer is subsequently developed by applying a developer to the selectively exposed photoresist layer in operation S112. As shown in FIG. 5, a developer 57 is supplied from a nozzle 62 to the photoresist layer 15. In some embodiments, the exposed region 50 of the photoresist layer radiation is removed by the developer 57 forming a pattern of openings 55a in the photoresist layer 15 to expose the substrate 10, as shown in FIG. 6A. In other embodiments, the unexposed region 52 of the photoresist layer is removed by the developer 57 forming a pattern of openings 55b in the photoresist layer 15 to expose the substrate 10, as shown in FIG. 6B.

In some embodiments, the photoresist developer 57 includes a solvent, and an acid or a base. In some embodiments, the concentration of the solvent is from about 60 wt. % to about 99 wt. % based on the total weight of the photoresist developer. The acid or base concentration is from about 0.001 wt. % to about 20 wt. % based on the total weight of the photoresist developer. In certain embodiments, the acid or base concentration in the developer is from about 0.01 wt. % to about 15 wt. % based on the total weight of the photoresist developer. At chemical component concentrations below the disclosed range there may be insufficient development. At chemical component concentrations greater than the disclosed range, there may be overdevelopment and waste of materials.

In some embodiments, the developer 57 is applied to the photoresist layer 15 using a spin-on process. In the spin-on process, the developer 57 is applied to the photoresist layer 15 from above the photoresist layer 15 while the photoresist-coated substrate is rotated, as shown in FIG. 5. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments. At spin rates, times, and temperatures below the disclosed range there may be insufficient development. At spin rates, times, and temperatures greater than the disclosed range, there may be degradation of the resist pattern.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

Figure 7A:
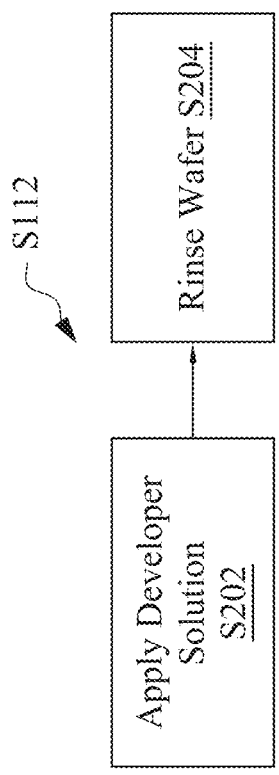
FIGS. 7A, 7B, 7C, 7D, and 7E show developing and cleaning process, a system for developing and cleaning the substrate, development material and water residues on the substrate, and a defect caused by the residues in an etched pattern on the substrate.
Figure 7B:
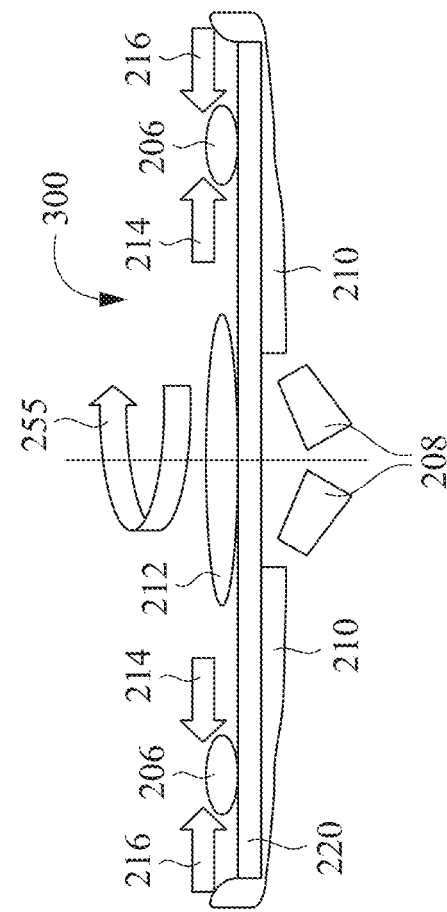
Figure 7E:
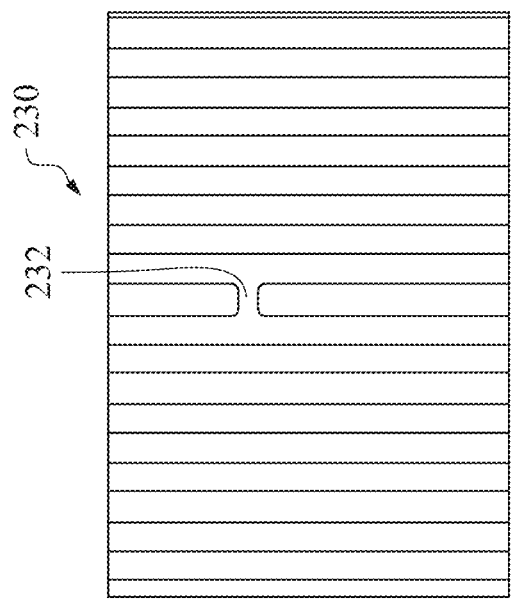
Figure 7C:
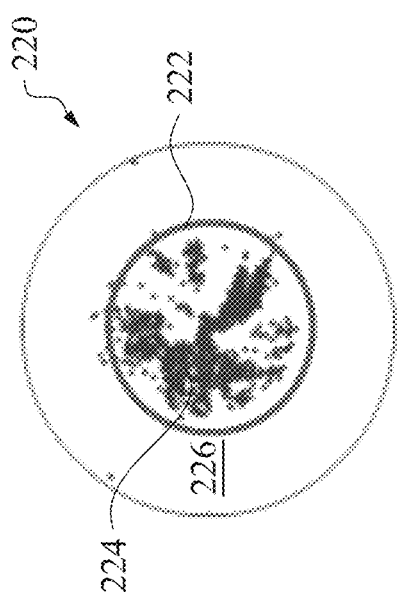
Figure 7D:
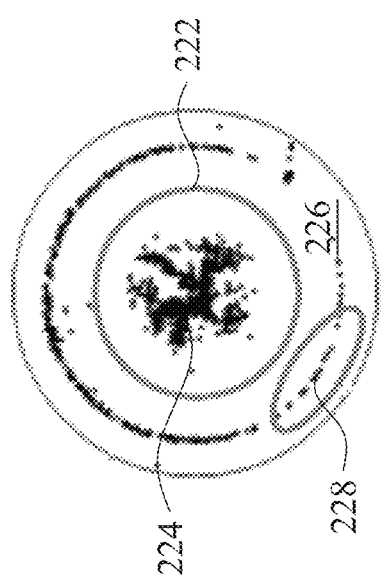

FIGS. 7A, 7B, 7C, 7D, and 7E show an embodiment of the developing and cleaning process, a system for developing and cleaning the substrate, development material and water residues on the substrate, and a defect caused by the residues in an etched pattern on the substrate. As shown in FIG. 7A, the development operation S112 includes the operation of applying the developer solution S202 followed by a rinsing operation to rinse the wafer in operation S204 with deionized water. FIG. 7B shows a system 300 for developing and cleaning the substrate 220. As shown, the development material 212 that may include deionized (DI) water is moved 214 to the edges of the substrate 220 by centrifugal force caused by rotation 255 of the substrate. In some embodiments, as shown in FIG. 7C, the centrifugal force is not strong enough to remove all of the development material and some development material residue 224 remains on the substrate 220. In some embodiments, the development material is clustered in a central region 222 of the substrate 220. In some embodiments, as shown in FIG. 7B, the back side of the substrate 220 is cleaned by DI water that is delivered through the nozzles 208 tilted at an acute angle relative to the back side surface of the substrate. In some embodiments, cleaning the back side of the substrate 220 causes the DI water 210 to get over the edges of the substrate and blocks 216 the removal of developer and development residue material 206 from an edge region 226 of the substrate 220. As shown in FIG. 7D, in some embodiments, residues 228 remain in the edge region 226 of the substrate, resulting from washing the backside. FIG. 7E shows a defect 232 generated after a subsequent etching operation in an etched pattern 230 because of the development residue material 206 or DI water residue remaining on the top surface of the substrate 220.

Figure 8D:
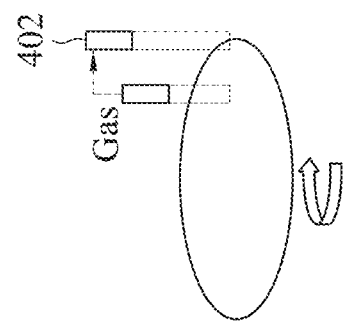
FIGS. 8A, 8B, 8C, 8D, 8E, 8F, 8G, 8H, 8I, and 8J show cleaning the development material and gas purging the substrate, a gas purge system and nozzles for gas purging, and development material and water residues with and without gas purging in accordance with some embodiments of the present disclosure.
Figure 8C:
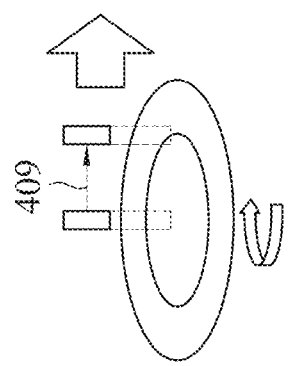
Figure 8B:
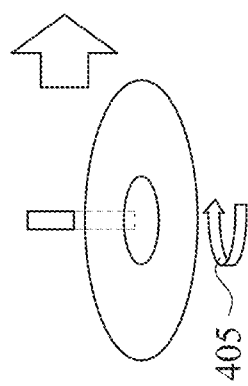
Figure 8A:
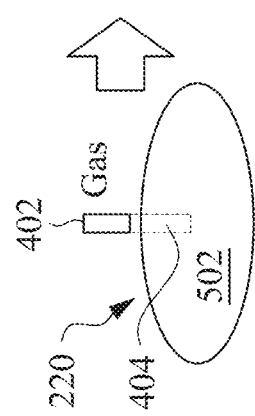

FIGS. 8A, 8B, 8C, 8D, 8E, 8F, 8G, 8H, 8I, and 8J show a gas purge operation S302 to clean developer and development residue material from the substrate, a gas purge system and nozzles for gas purging, and development material and water residues with and without gas purging in accordance with some embodiments of the present disclosure. As shown in FIG. 8A, development material 502, including developer and dissolved photoresist, is spread on the substrate 220. A purge gas is projected by a gas stream 404, a nozzle 402 to the surface of the substrate 220. In some embodiments, the purge gas is one or more gases selected from the group consisting of clean dry air, nitrogen, argon, helium, neon, and carbon dioxide. In some embodiments, the purge gas has less than about 1 ppb impurities and less than about 1% relative humidity.

As shown in FIG. 8B, the substrate rotates along a clockwise direction 405 in some embodiments, and the centrifugal force moves the development material away from the center of the substrate 220 to the edge of the substrate 220. As shown, the gas stream 404 helps push the development material off the surface of the substrate. As shown in FIG. 8C, the nozzle 402 also moves in a radial direction 409 from the center to the edge of the substrate to help remove the development material from the surface of the substrate 220 in some embodiments. In some embodiments, a flow rate of the purge gas during the applying a purge gas ranges from about 50 cc/s to about 2000 cc/s. In some embodiments, a flow rate of the purge gas during the applying a purge gas ranges from about 100 cc/s to about 1000 cc/s. In other embodiments, a flow rate of the purge gas during the applying a purge gas ranges from about 150 cc/s to about 500 cc/s. In some embodiments, the purge gas is applied to the substrate for about 10 seconds to about 20 minutes. In some embodiments, the purge gas is applied to the substrate for about 30 seconds to about 10 minutes. In some embodiments, the purge gas is applied to the substrate for about 1 minute to about 5 minutes. In some embodiments, the purge gas flow rate is varied (e.g., decreasing) during the applying the purge gas. For example, in some embodiments, a purge gas flow rate of about 200 cc/s is applied to the wafer for about 1 minute and then a purge gas flow rate of about 100 cc/s is applied for about 10 minutes. In another embodiment, a purge gas flow rate of about 1000 cc/s is applied for about 1 minute and then a purge gas flow rate of about 100 cc/s is applied for about 1 minute. In another embodiment, a purge gas flow rate of about 200 cc/s is applied for about 5 minutes and then a purge gas flow rate of about 100 cc/s is applied for about 5 minutes. At purge gas flow rates and purge gas flow times below the disclosed ranges, there may be insufficient removal of the residues. At purge gas flow rates and purge gas flow times greater than the disclosed ranges, there may be increased manufacturing costs with no significant improvement in the defect rate or device performance.

In some embodiments, the purge gas supply nozzle moves along a radial direction of the substrate at a speed ranging from 0.125 mm/s to 15 mm/s while the purge gas is applied. In some embodiments, the purge gas supply nozzle moves along a radial direction of the substrate at a speed ranging from 0.25 mm/s to 7 mm/s while the purge gas is applied. In other embodiments, the purge gas supply nozzle moves along a radial direction of the substrate at a speed ranging from 0.5 mm/s to 4 mm/s while the purge gas is applied. At purge gas supply nozzle speeds below the disclosed ranges and greater than the disclosed ranges there may be insufficient removal of the residues and increased manufacturing costs with no significant improvement in the defect rate or device performance.

As shown in FIG. 8D, in some embodiments, the nozzle 402 moves away from the substrate 220 in the vertical direction when the nozzle 402 reaches the periphery of the substrate 220. In some embodiments, the nozzle 402 rises about 1 mm to about 5 mm when it reaches the periphery of the substrate 220 to further provide efficient residue removal at the periphery.

Figure 8E:
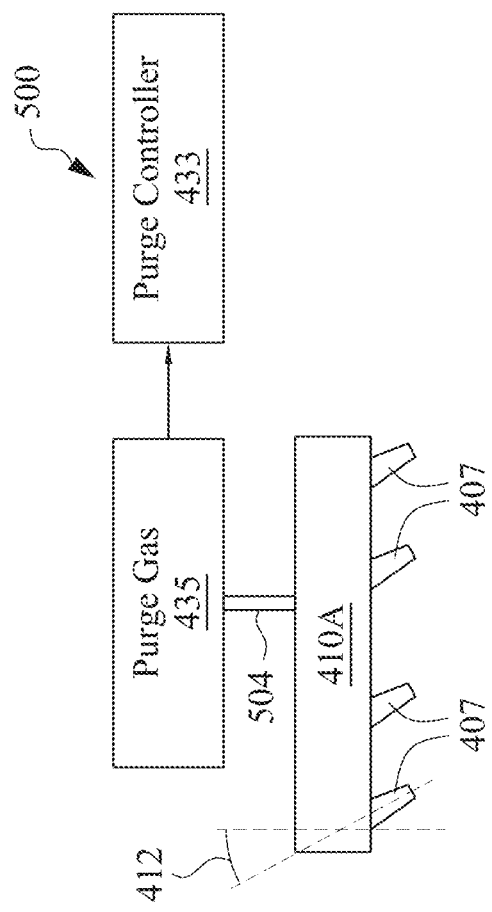
Figure 8F:
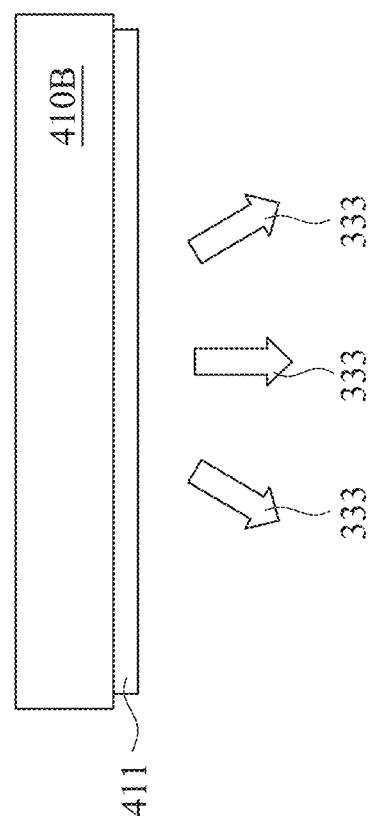

FIG. 8E shows a purge system 500 having a purge controller 433, and a purge gas tank 435 that is connected through a pipe 504 to a nozzle system 410A in some embodiments. In some embodiments, the nozzle system 410A is positioned parallel to the substrate 220 when purging the development material from the substrate 220. The nozzle system 410A includes two or more, e.g., 4, nozzles 407 arranged at an angle 412 with respect to a vertical line to the surface of the substrate 220 to push the development material off the surface of the substrate 220. In some embodiments, a length of the nozzle system 410A is between about 50 mm to 300 mm. As shown in FIG. 8F, in some embodiments, the nozzle system 410B has an extended nozzle 411 that drives the development material in different directions 333.

Figure 8J:
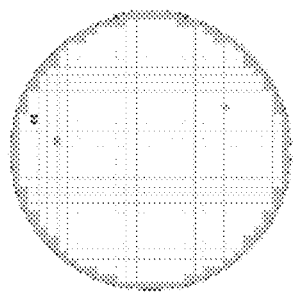
Figure 8I:
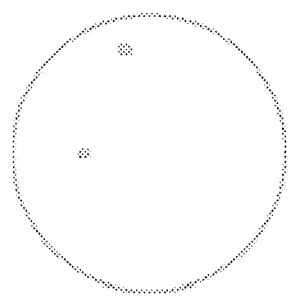
Figure 8H:
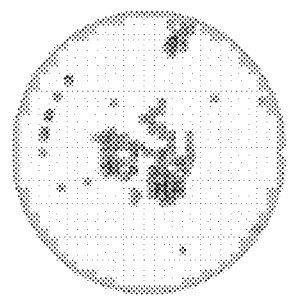
Figure 8G:
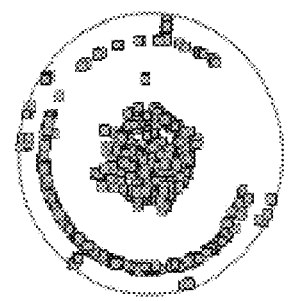

FIG. 8G shows a map of developer material residues on the surface of the substrate 220 when the back side of the substrate is cleaned and the gas purge operation S302 is not applied. FIG. 8I shows a map of residues on the surface of the substrate 220 for the same operation in FIG. 8G except the gas purge operation S302 is applied. FIG. 8H shows a map of residues on the surface of the substrate 220 when back side of the substrate is cleaned and the gas purge operation is not applied. FIG. 8J shows a map of residues on the surface of the substrate 220 for the same operation in FIG. 8H except the gas purge operation S302 is applied. As shown, the gas purge significantly reduces the developer material residues.

Figure 9B:
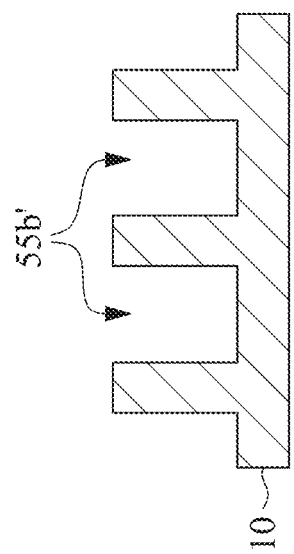
FIGS. 9A and 9B show a process stage of a sequential operation according to an embodiment of the disclosure.
Figure 9A:
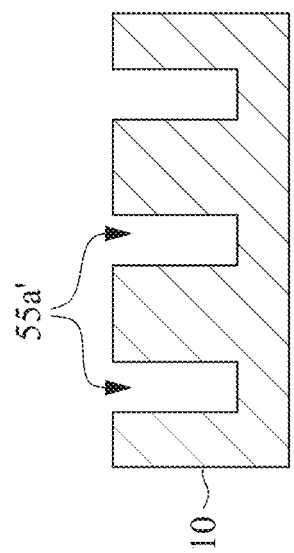

After the gas purge operation S302, the substrate is etched in etching operation S114 in some embodiments. In etching operation S114, the remaining resist material is used as a mask and the exposed regions of the substrate is etched to produce an etched pattern on the substrate. In some embodiments, the pattern of openings 55a, 55b in the photoresist layer 15 (see FIGS. 6A and 6B) are extended into the substrate 10 to create a pattern of openings 55a', 55b' in the substrate 10, thereby transferring the pattern in the photoresist layer 15 into the substrate 10, as shown in FIGS. 9A and 9B. The pattern is extended into the substrate by etching, using one or more suitable etchants. The remaining photoresist of the region 50, 52 is at least partially removed during the etching operation in some embodiments. In other embodiments, the remaining photoresist of the region 50, 52 is removed after etching the substrate 10 by using a suitable photoresist stripper solvent or by a photoresist ashing operation.

In some embodiments, the resist layer on the surface of the substrate is inspected after the development operation S112 in an after development inspection (ADI) operation S122 and the development material residue on the surface of the wafer is mapped. In some embodiments, the etched layer on the surface of the substrate is inspected after the etching operation S114 in an after etching inspection (AEI) operation S123 and the presence of any etching defects and development material residue on the surface of the wafer is mapped.

In some embodiments, the substrate 10 includes a single crystalline semiconductor layer on at least its surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric material having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

The photoresist layer 15 is a photosensitive layer that is patterned by exposure to actinic radiation. Typically, the chemical properties of the photoresist regions struck by incident radiation change in a manner that depends on the type of photoresist used. Photoresist layers 15 are either positive tone resists or negative tone resists. A positive tone resist refers to a photoresist material that when exposed to radiation, such as UV light, becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

Whether a resist is a positive tone or negative tone may depend on the type of developer used to develop the resist. For example, some positive tone photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent, such as n-butyl acetate (nBA). Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development.

In some embodiments, the photoresist layer 15 includes a high sensitivity photoresist composition. In some embodiments, the high sensitivity photoresist composition is highly sensitive to extreme ultraviolet (EUV) radiation. In some embodiments, the photoresist composition includes a polymer, a photoactive compound (PAC), and a sensitizer. In some embodiments, the photoresist includes metal nanoparticles.

In some embodiments, the resist layer 15 is a tri-layer resist. A tri-layer resist includes a bottom layer, a middle layer, and an upper layer. In some embodiments, the bottom layer is a planarizing layer or a bottom anti-reflective coating (BARC) layer. In some embodiments, the bottom layer is formed of a carbon backbone polymer. In some embodiments, the middle layer is a made of a silicon-containing material. In some embodiments, the middle layer is an anti-reflective layer. The upper layer is a photosensitive layer that is patterned like the photoresist layers described herein.

Figures 10A, 10B:
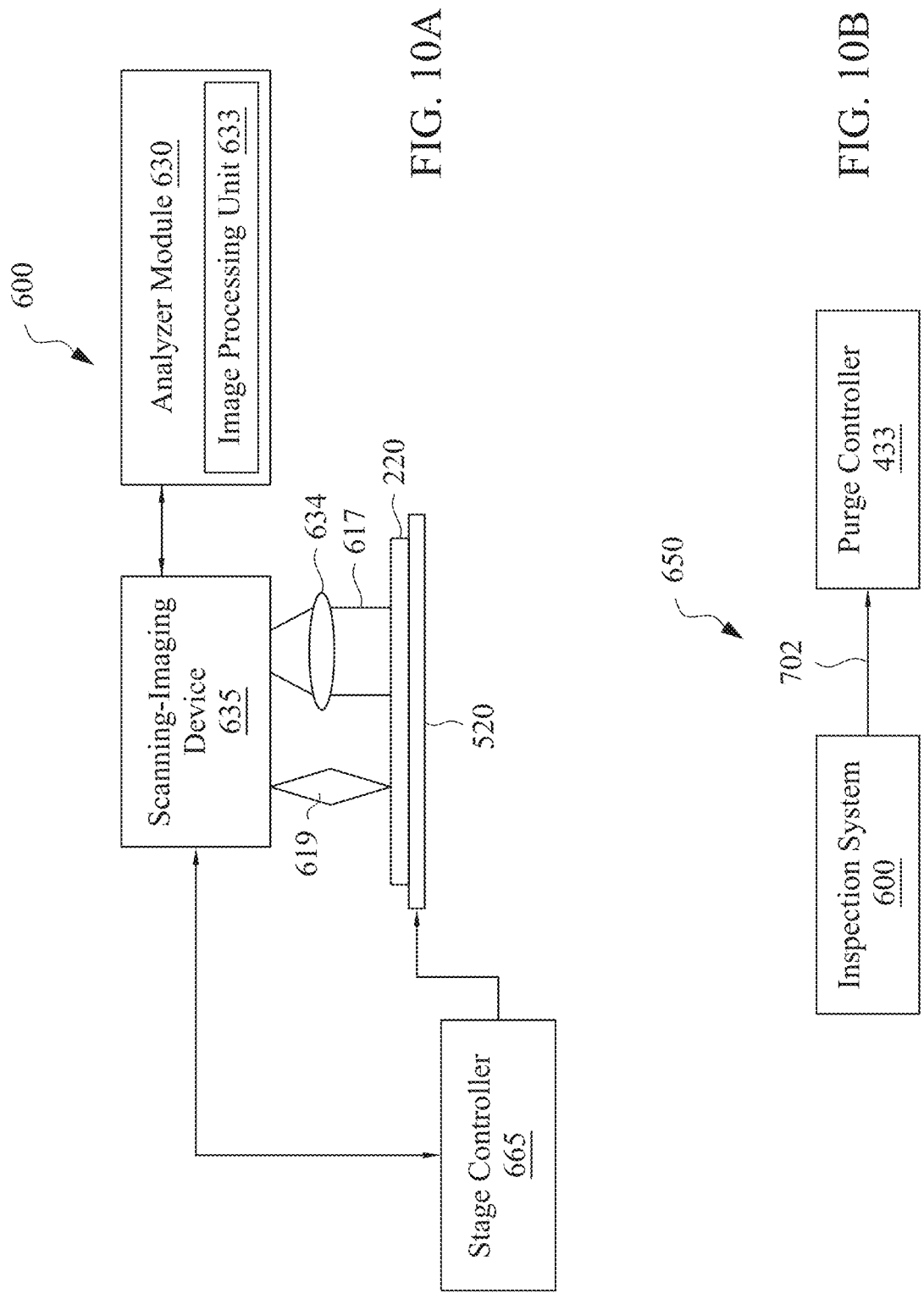
FIGS. 10A and 10B show an inspection system of the residue and defects on a surface of the substrate and a system that controls gas purging of the substrate in accordance with some embodiments of the present disclosure.

FIGS. 10A and 10B show an inspection system 600 for inspecting residue and defects on a surface of the substrate and a system that controls gas purging of the substrate in accordance with some embodiments of the present disclosure. FIG. 10A shows a scanning-imaging device 635 that generates a focusing beam 619 for scanning a top surface of the substrate 220 and generates an image of the top surface of the substrate 220. In addition, FIG. 10A shows the scanning-imaging device 635 and a lens 634 that generates a uniform light beam 617 for imaging the top surface of the substrate 220 and generating the image of the top surface of substrate 220. FIG. 10A shows the substrate 220 disposed on the stage 520. The stage 520 is coupled and controlled by a stage controller 665. The scanning-imaging device 635 captures one or more images of the surface of the substrate 220 at different locations of the substrate 220 and sends the images to the analyzer module 630 or the image processing unit 633. The analyzer module 630 or the image processing unit 633 of the analyzer module 630 determines the number of residues and locations of the residue on the substrate 220, e.g., a map of the residues. If the number of residues, or a density of the residues, e.g., residues per square millimeter of the surface of the substrate 220, is above a threshold value, the information is sent to a purge controller 433 and the purge controller 433 increases the time of the gas purge operation S302 or the flow rate of the purge gas in some embodiments. In some embodiments, the threshold value of the residue is greater than 1 residue/mm$^2$. In some embodiments, the threshold value of the residue is greater than 0.5 residues/mm$^2$. In other embodiments, the threshold value of the residue is greater than 0.1 residues/mm$^2$.

FIG. 10B shows a purge system 650 that includes the inspection system 600 coupled to the purge controller 433. In some embodiments, the residues, e.g., the residues of FIG. 10A, on the surface of a substrate 220 are inspected by the inspection system and a map 702 of the residues on the surface of the substrate, e.g., location and size, is generated. The substrate and the map 702 are transferred to the purge controller 433. The purge controller 433 determines how to move the nozzles during the gas purge and how long to keep the nozzles turned on over a region of the substrate.

Figure 11:
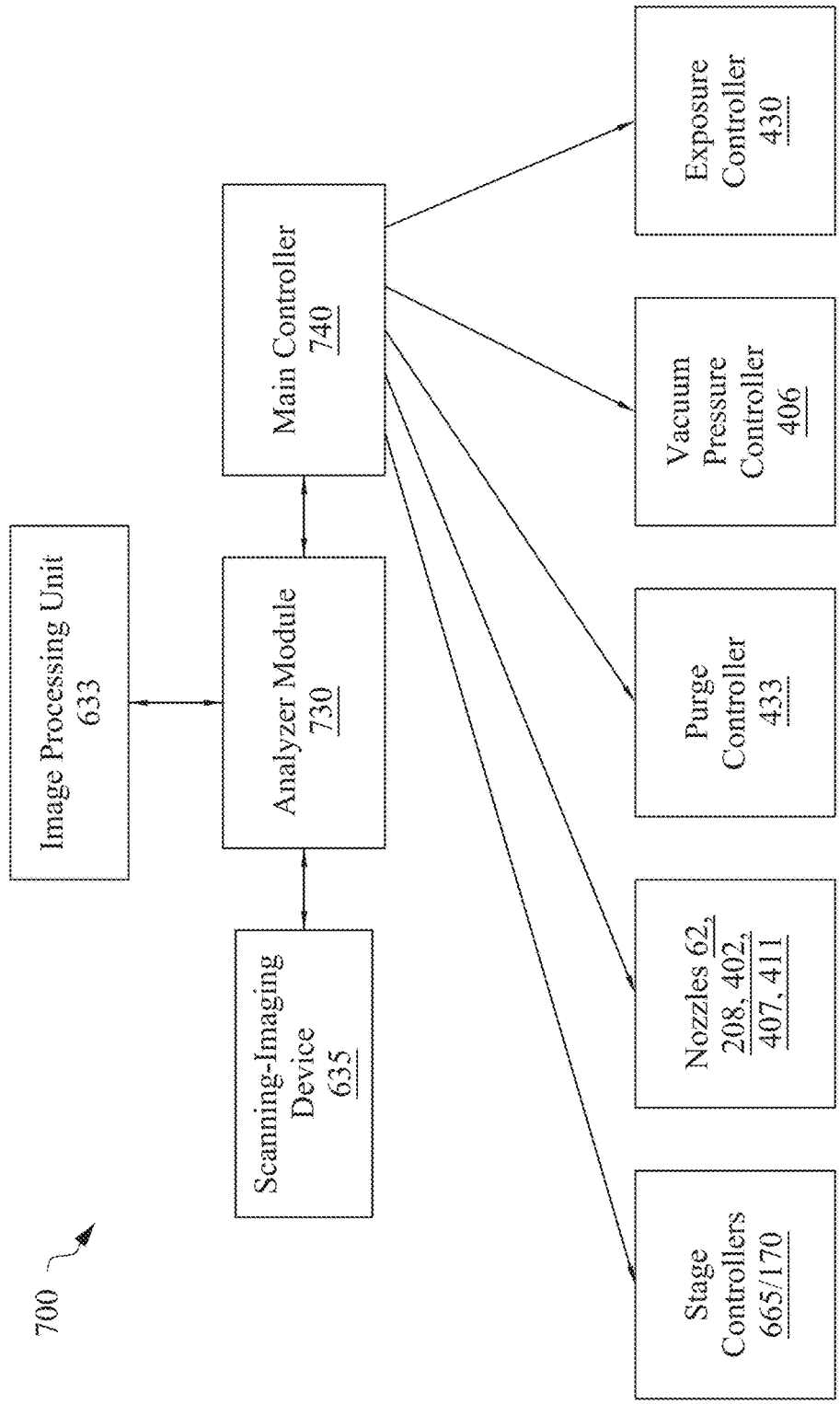
FIG. 11 shows a control system for controlling the gas purging of the substrate in accordance with some embodiments of the present disclosure.

FIG. 11 shows a control system 700 programmed to control the gas purging of the substrate in accordance with some embodiments of the present disclosure. The control system 700 includes an analyzer module 630 and a main controller 740 coupled to each other. In some embodiments, the main controller is programmed to: control a spin rate of the rotatable wafer stages 160, 520; dispensing of liquid or gas from any of the nozzles 62, 208, 402, 407, 411; translational motion of any of the nozzles 62, 208, 402, 407, 411; and a tilt angle of any of the nozzles 62, 208, 402, 407, 411 relative to surfaces of the substrate. As shown in FIG. 11, the main controller 740 is programmed to control one or more of the analyzer module 630, and the image processing unit 633 and scanning-imaging device 635 through the analyzer module 630. In addition, the main controller 740 is programmed to control the substrate stage controllers 170, 665; the various nozzles 62, 208, 402, 407, 411; the purge controller 433; the vacuum pressure controller 406; and the exposure controller 430.

Figure 12:
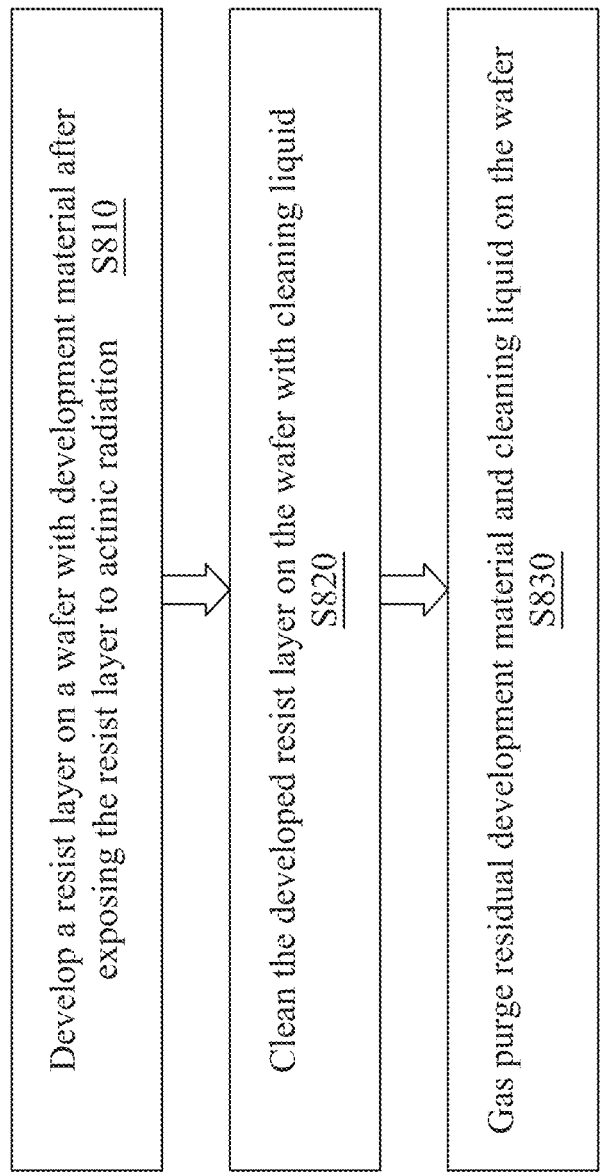
FIG. 12 shows a flow diagram of a process for gas purging the substrate after development process in accordance with some embodiments of the present disclosure.

FIG. 12 shows a flow diagram of a process 800 for gas purging the substrate after development process in accordance with some embodiments of the present disclosure. In some embodiments, a resist layer 15 on the substrate 10 is developed with the photoresist developer 57 (a development material) after selectively exposing the resist layer to actinic radiation in operation S810. The developed resist layer 15 is cleaned with a cleaning liquid, such as deionized water, in operation S820. Then, in operation S830, a gas purge is applied to the substrate 10 to remove residual development material and cleaning liquid. In some embodiments, the substrate 10 is subsequently is inspected to verify the sufficiency of the gas purge operation.

Figure 13A:
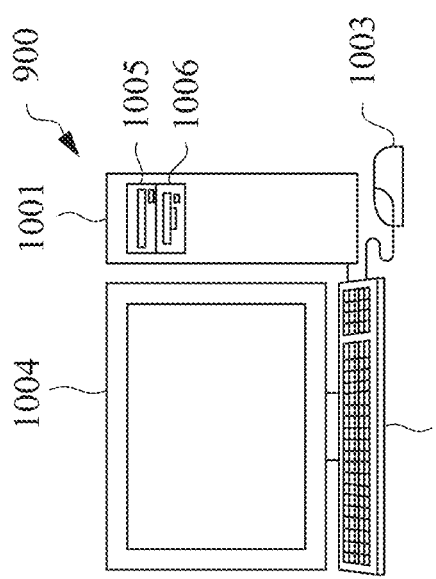
FIGS. 13A and 13B illustrate an apparatus for controlling the gas purging of the substrate in accordance with some embodiments of the present disclosure.
Figure 13B:
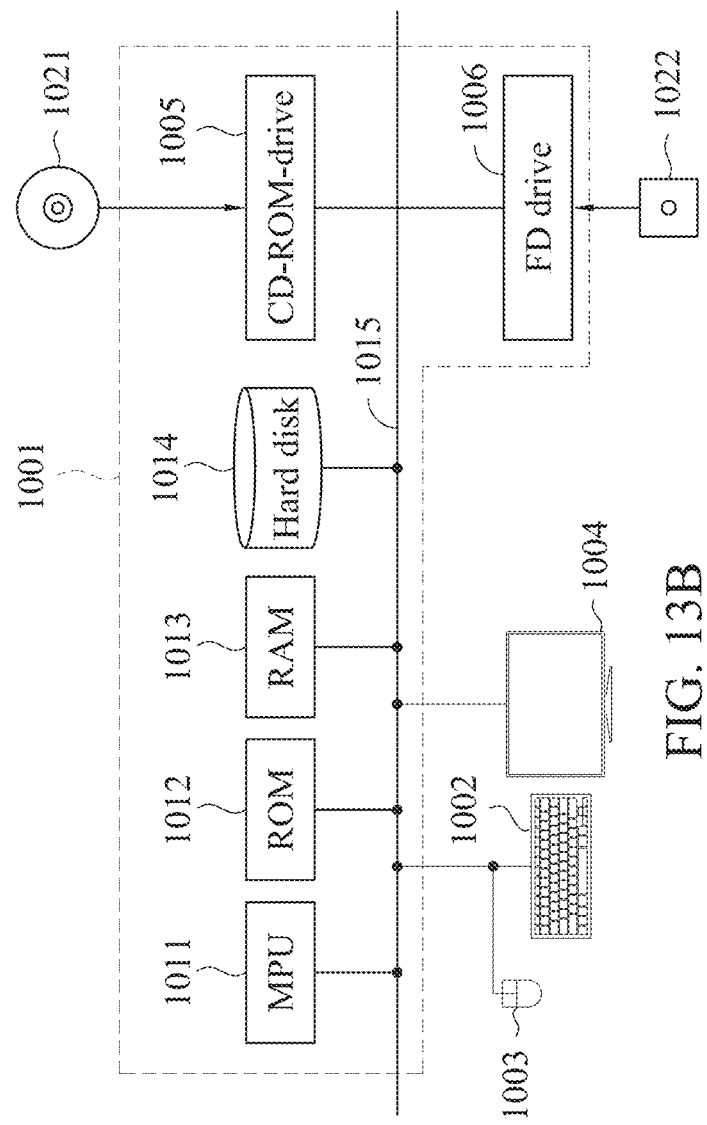

FIGS. 13A and 13B illustrate an apparatus for controlling the method for manufacturing a semiconductor device in accordance with some embodiments of the present disclosure. In some embodiments, the computer system 900 is used for performing the functions of the modules of FIG. 11 that include the main controller 740, the analyzer module 730, consistent with the analyzer module 630 of FIG. 10A, the stage controller 665 or 170, the vacuum pressure controller 406, and the image processing unit 633 that is included in the analyzer module 730 in some embodiments. In some embodiments, the computer system 900 is used to execute the process 100 of FIG. 1 and process 800 of FIG. 12.

FIG. 13A is a schematic view of a computer system that performs the functions of a controller for controlling the method for manufacturing a semiconductor device, including the gas purge of a substrate. All of or a part of the processes, method and/or operations of the foregoing embodiments can be realized using computer hardware and computer programs executed thereon. In FIG. 13A, a computer system 900 is provided with a computer 1001 including an optical disk read only memory (e.g., CD-ROM or DVD-ROM) drive 1005 and a magnetic disk drive 1006, a keyboard 1002, a mouse 1003, and a monitor 1004.

FIG. 13B is a diagram showing an internal configuration of the computer system 900. In FIG. 13B, the computer 1001 is provided with, in addition to the optical disk drive 1005 and the magnetic disk drive 1006, one or more processors, such as a micro processing unit (MPU) 1011, a ROM 1012 in which a program such as a boot up program is stored, a random access memory (RAM) 1013 that is connected to the MPU 1011 and in which a command of an application program is temporarily stored and a temporary storage area is provided, a hard disk 1014 in which an application program, a system program, and data are stored, and a bus 1015 that connects the MPU 1011, the ROM 1012, and the like. Note that the computer 1001 may include a network card (not shown) for providing a connection to a LAN.

The program for causing the computer system 900 to execute the functions for manufacturing a semiconductor device in the foregoing embodiments may be stored in an optical disk 1021 or a magnetic disk 1022, which are inserted into the optical disk drive 1005 or the magnetic disk drive 1006, and transmitted to the hard disk 1014. Alternatively, the program may be transmitted via a network (not shown) to the computer 1001 and stored in the hard disk 1014. At the time of execution, the program is loaded into the RAM 1013. The program may be loaded from the optical disk 1021 or the magnetic disk 1022, or directly from a network. The program does not necessarily have to include, for example, an operating system (OS) or a third party program to cause the computer 1001 to execute the functions of the control system for the gas purge operations in the foregoing embodiments. The program may only include a command portion to call an appropriate function (module) in a controlled mode and obtain desired results.

Figure 14:
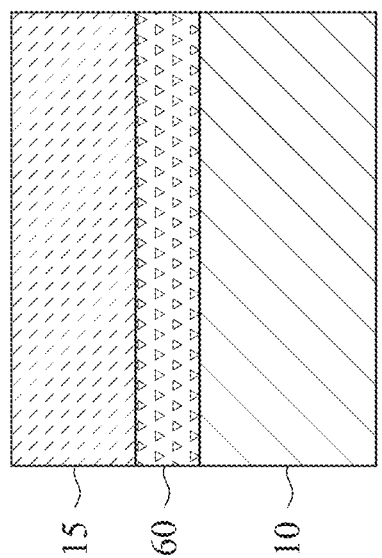
FIG. 14 shows a schematic view of an exposure device of a lithography system for generating a photo resist pattern on a wafer.

In some embodiments, a layer to be patterned 60 is disposed over the substrate 10 prior to forming the photoresist layer, as shown in FIG. 14. In some embodiments, the layer to be patterned 60 is a metallization layer or a dielectric layer, such as a passivation layer, disposed over a metallization layer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation techniques, including thermal oxidation, chemical vapor deposition, atomic layer deposition, and physical vapor deposition.

Figure 15B:
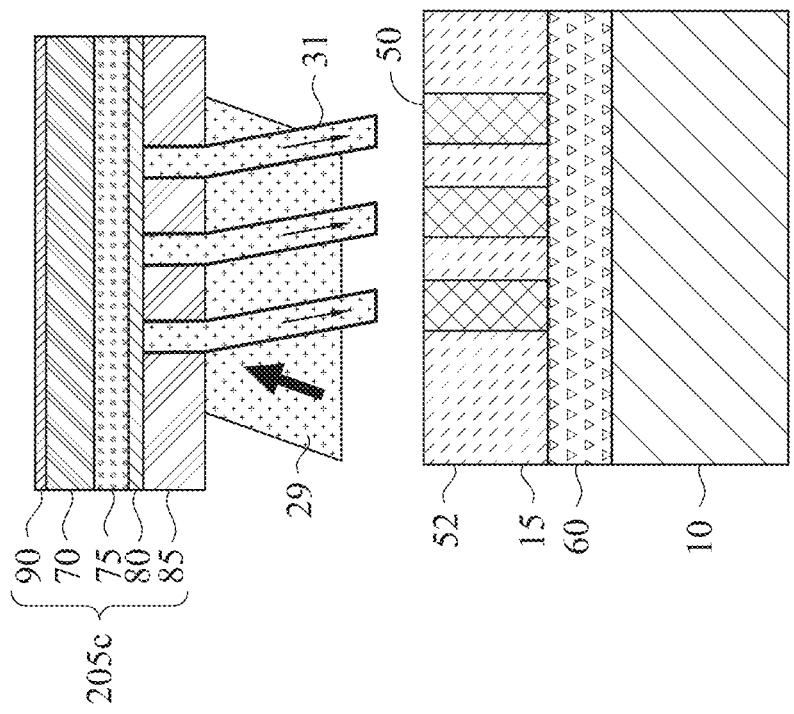
FIGS. 15A and 15B show a process stage of a sequential operation according to an embodiment of the disclosure.
Figure 15A:
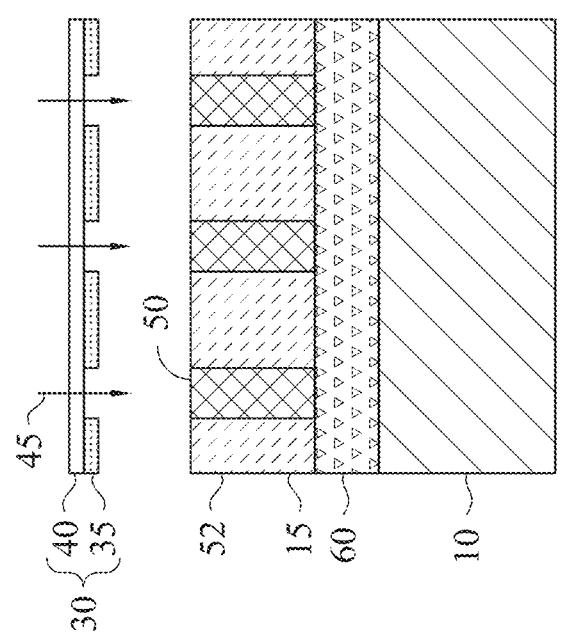

The photoresist layer 15 is subsequently selectively exposed or patternwise exposed to actinic radiation 45 to form exposed regions 50 and unexposed regions 52 in the photoresist layer, as shown in FIGS. 15A and 15B, and described herein in relation to FIGS. 4A and 4B.

Figure 17A:
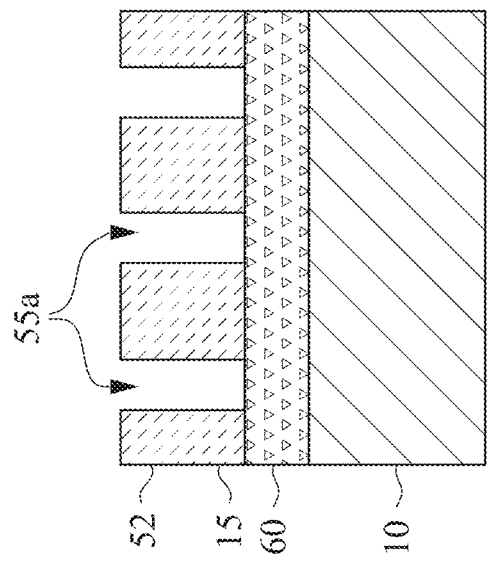
FIGS. 17A and 17B show a process stage of a sequential operation according to an embodiment of the disclosure.
Figure 17B:
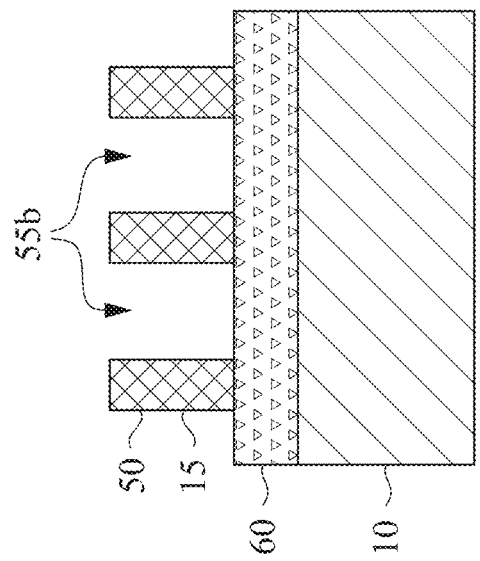
Figure 16:
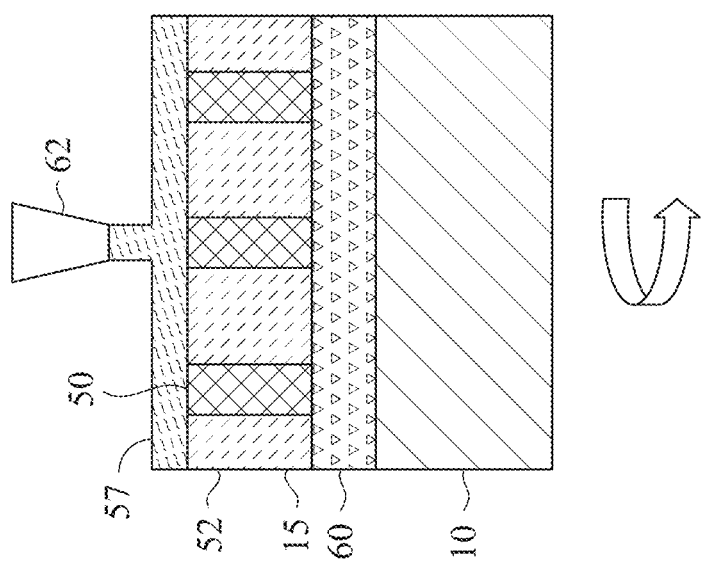
FIG. 16 shows a process stage of a sequential operation according to an embodiment of the disclosure.
Figure 18D:
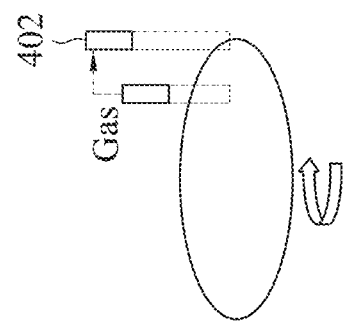
FIGS. 18A, 18B, 18C, and 18D show developing and cleaning process according to an embodiment of the disclosure.
Figure 18C:
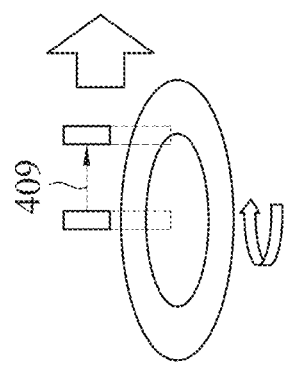
Figure 18B:
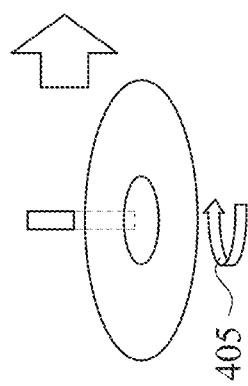
Figure 18A:
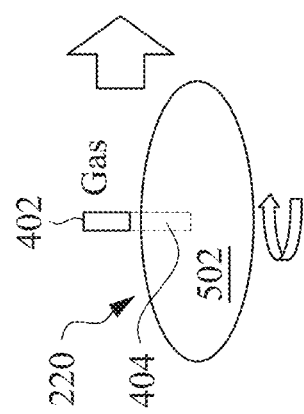

As shown in FIG. 16, the selectively exposed or patternwise exposed photoresist layer 15 is developed by dispensing developer 57 from a nozzle 62 to form a pattern of photoresist openings to produce the pattern of openings 55a, 55b, in the photoresist layer, as shown in FIGS. 17A and 17B, and described herein in relation to FIGS. 5, 6A, and 6B. FIG. 17A illustrates the development of a positive tone photoresist, and FIG. 17B illustrates the development of a negative tone photoresist.

Then, as shown in FIGS. 18A, 18B, 18C, and 18D, a gas purge operation S302 is performed to clean developer and development residue material from the substrate, as described herein in relation to FIGS. 8A-8D.

Figure 19B:
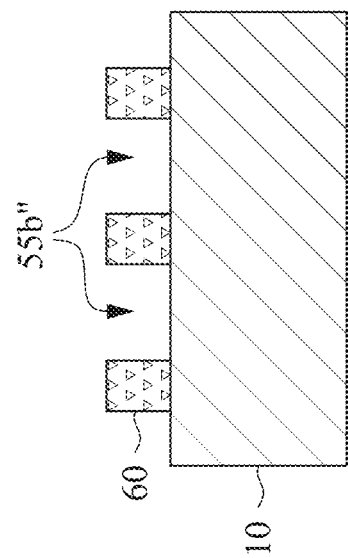
FIGS. 19A and 19B show a process stage of a sequential operation according to an embodiment of the disclosure.
Figure 19A:
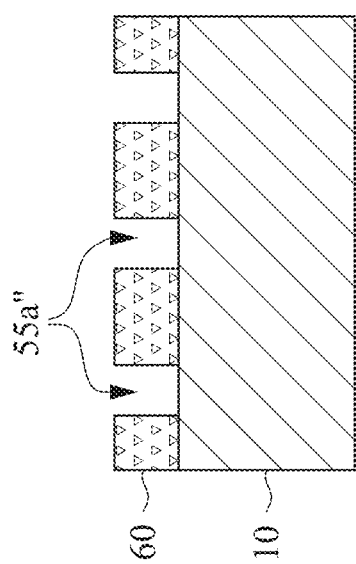

Then, as shown in FIGS. 19A and 19B, the pattern of openings 55a, 55b (see FIGS. 17A and 17B) in the photoresist layer 15 is transferred to the layer to be patterned 60 using an etching operation and the photoresist layer is removed, as explained with reference to FIGS. 9A and 9B to form the pattern of openings 55a", 55b" in the layer to be patterned 60.

The gas purge techniques described herein are not limited to removing developer material residues from semiconductor substrates. In some embodiments, the gas purge techniques disclosed herein are used to remove excess amounts and residues of other coatings. For example, in some embodiments, the gas purge techniques are used to remove excess or residues of photoresist coatings; polymeric insulating layers, including polyimide layers; bottom anti-reflective coating (BARC) layers; top anti-reflective coating (TARC) layers; and spin-on-glass (SOG) layers. The gas purge techniques can be used to blow away any chemicals from the surface of the substrate.

Other embodiments include other operations before, during, or after the operations described above. In some embodiments, the disclosed methods include forming semiconductor devices, including fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof are formed, according to embodiments of the disclosure.

As described in the foregoing embodiments, after the development process the substrate is purged by gas such that development material or DI wafer residues are removed from the surface of the wafer. Removal of the residues cause the layout pattern to form, without error or defect, on a resist layer on the surface of the wafer and, thus, when the resist layer is used for etching, the defects in etched pattern is reduced. In some embodiments, the amount of residue is significantly reduced, such that there are only several residue particles remaining on a wafer. In some embodiments, the amount of residue particles on the wafer after gas purging is less than 0.1 particles/mm$^2$. In some embodiments, no residue particles are detected on a wafer during an after development inspection.

An embodiment of the disclosure is a method for manufacturing a semiconductor device, including forming a photoresist layer comprising a photoresist composition over a substrate to form a photoresist-coated substrate. The photoresist layer is selectively exposed to actinic radiation to form a latent pattern in the photoresist layer. The latent pattern is developed by applying a developer to the selectively exposed photoresist layer to form a patterned photoresist layer exposing a portion of the substrate, and a purge gas is applied to the patterned photoresist layer. In an embodiment, the method includes inspecting the patterned photoresist layer after applying the purge gas and determining an amount of residue remaining on the substrate after the developing. In an embodiment, when the amount of residue exceeds a threshold amount a parameter of applying a purge gas pattern is changed before developing a latent pattern on a subsequent photoresist-coated substrate. In an embodiment, the parameter of applying a gas purge pattern includes one or more parameters selected from the group consisting of a purge gas flow rate, a duration of time of applying the purge gas, an angle of a stream of purge gas relative to pattern, a rotation speed of the substrate, a translational speed of a gas nozzle supplying the purge gas across a face of the patterned photoresist layer. In an embodiment, the method includes etching exposed portions of the substrate. In an embodiment, the method includes inspecting the substrate after the etching the exposed portions of the substrate. In an embodiment, a flow rate of the purge gas during the applying a purge gas ranges from 50 cc/s to 2000 cc/s. In an embodiment, the purge gas is one or more gases selected from the group consisting of clean dry air, nitrogen, argon, helium, neon, and carbon dioxide. In an embodiment, the substrate is rotated while the purge gas is applied. In an embodiment, a purge gas supply nozzle moves along a radial direction of the substrate at a speed ranging from 0.125 mm/s to 15 mm/s during the applying a purge gas.

Another embodiment of the disclosure is a method for manufacturing a semiconductor device, including forming a photoresist layer over a first main surface of a wafer. The photoresist layer is patternwise exposed to actinic radiation to form a latent pattern in the photoresist layer. A developer solution is applied to the latent pattern to form a pattern in the photoresist layer. Deionized water is applied to the pattern after applying the developer solution. A gas stream is applied via a nozzle to the pattern after the applying deionized water. In an embodiment, deionized water is applied to a second main surface of the wafer before the applying a gas stream, wherein the second main surface opposes the first main surface. In an embodiment, the wafer is rotated during the applying a developer solution, the applying deionized water, and the applying a gas stream. In an embodiment, a flow rate of the gas stream is varied during the applying the gas stream within a gas flow rate ranging from 50 cc/s to 2000 cc/s. In an embodiment, a translational speed of the nozzle is varied as the nozzle moves along a radial direction of the wafer at a speed ranging from 0.125 mm/s to 15 mm/s during the applying a gas stream.

Another embodiment of the disclosure is a system for manufacturing a semiconductor device, including a rotatable wafer stage configured to support a photoresist-coated wafer disposed in a chamber. A first nozzle is disposed in the chamber configured to dispense a liquid onto a first main surface of the photoresist-coated wafer. A second nozzle is disposed in the chamber configured to apply a gas onto the first main surface of the photoresist-coated wafer. A controller is programmed to: control a spin rate of the rotatable wafer stage, dispensing of a liquid from the first nozzle, applying the gas from the second nozzle, translational motion of the first nozzle and the second nozzle, and an angle of the nozzle relative to the first main surface of the photoresist-coated wafer. In an embodiment, the system includes a third nozzle disposed in the chamber configured to dispense a liquid onto a second main surface of the photoresist-coated wafer, wherein the second main surface opposes the first main surface. In an embodiment, the system includes a fourth nozzle disposed in the chamber configured to apply the gas onto the first main surface of the photoresist-coated wafer. In an embodiment, the system includes an inspection tool configured to inspect a surface of the photoresist-coated wafer, wherein the inspection tool includes: a wafer inspection support stage, a scanning/imaging device, and an analyzer module. In an embodiment, the controller is further programmed to control: the wafer inspection support stage, the scanning/imaging device, and the analyzer module.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a photoresist layer comprising a photoresist composition over a substrate to form a photoresist-coated substrate;
   selectively exposing the photoresist layer to actinic radiation to form a latent pattern in the photoresist layer;
   developing the latent pattern by applying a developer to the selectively exposed photoresist layer to form a patterned photoresist layer exposing a portion of the substrate; and
   applying a purge gas to the patterned photoresist layer by a gas nozzle arranged at an angle relative to a vertical line that is perpendicular to a surface of the substrate to push residue of the developer off the surface of the substrate,
   wherein
   the gas nozzle moves along a radial direction of the substrate, and wherein the gas nozzle rises in a range from 1 mm to 5 mm in a vertical direction from the substrate when the gas nozzle reaches a periphery of the substrate.

2. The method according to claim 1, further comprising inspecting the patterned photoresist layer after applying the purge gas and determining an amount of residue remaining on the substrate after the developing.

3. The method according to claim 2, wherein when the amount of residue exceeds a threshold amount changing a parameter of applying a purge gas pattern before developing a latent pattern on a subsequent photoresist-coated substrate.

4. The method according to claim 3, wherein the parameter of applying a gas purge pattern includes one or more parameters selected from the group consisting of a purge gas flow rate, a duration of time of applying the purge gas, an angle of a stream of purge gas relative to pattern, a rotation speed of the substrate, a translational speed of the gas nozzle supplying the purge gas across a face of the patterned photoresist layer.

5. The method according to claim 1, further comprising etching exposed portions of the substrate.

6. The method according to claim 5, further comprising inspecting the substrate after the etching the exposed portions of the substrate.

7. The method according to claim 1, wherein the purge gas is one or more gases selected from the group consisting of clean dry air, nitrogen, argon, helium, neon, and carbon dioxide.

8. The method according to claim 1, wherein the substrate is rotated while the purge gas is applied.

9. The method according to claim 1, wherein the gas nozzle moves along a radial direction of the substrate at a speed ranging from 0.125 mm/s to 15 mm/s during the applying a purge gas.

10. A method for manufacturing a semiconductor device, comprising:
    forming a photoresist layer over a first main surface of a wafer;
    patternwise exposing the photoresist layer to actinic radiation to form a latent pattern in the photoresist layer;
    applying a developer solution to the latent pattern to form a pattern in the photoresist layer;
    applying deionized water to the pattern after applying the developer solution; and
    applying a gas stream via a nozzle to the pattern after the applying deionized water, wherein the nozzle is arranged at an angle relative to a vertical line that is perpendicular to the first main surface of the wafer to push residue of the developer solution off the first main surface of the wafer,
    wherein
    the nozzle moves along a radial direction of the wafer, and wherein the nozzle rises in a range from 1 mm to 5 mm in a vertical direction from the wafer when the nozzle reaches a periphery of the wafer.

11. The method according to claim 10, further comprising applying deionized water to a second main surface of the wafer before the applying a gas stream, wherein the second main surface opposes the first main surface.

12. The method according to claim 10, wherein the wafer is rotated during the applying a developer solution, the applying deionized water, and the applying a gas stream.

13. The method according to claim 10, wherein a translational speed of the nozzle is varied as the nozzle moves along a radial direction of the wafer at a speed ranging from 0.125 mm/s to 15 mm/s during the applying a gas stream.

14. A method for manufacturing a semiconductor device, comprising:
    coating a photoresist on a wafer;
    placing the photoresist coated wafer on a rotatable wafer stage and disposed in a chamber;
    dispensing a liquid onto a first main surface of the wafer from a first nozzle disposed in the chamber;
    applying a gas onto the first main surface of the wafer from a second nozzle disposed in the chamber;
    controlling a spin rate of the wafer stage by a controller;
    controlling the dispensing of the liquid from the first nozzle by the controller; and
    controlling the applying of the gas from the second nozzle by the controller, wherein an angle of the second nozzle relative to the first main surface of the wafer is controlled by the controller, and wherein
    the second nozzle moves along a radial direction of the wafer, and wherein the second nozzle rises in a range from 1 mm to 5 mm in a vertical direction from the wafer when the second nozzle reaches a periphery of the wafer.

15. The method of claim 14, further comprising controlling translational motions of the first and the second nozzles by the controller.

16. The method of claim 14, further comprising controlling an angle of the first nozzle relative to the first main surface of the wafer by the controller.

17. The method of claim 14, further comprising dispensing the liquid onto a second main surface of the wafer from a third nozzle disposed in the chamber, wherein the second main surface opposes the first main surface.

18. The method of claim 14, further comprising inspecting the first main surface of the wafer by an inspection tool that is controlled by the controller, wherein the inspection tool comprises a wafer inspection support stage, a scanning/imaging device, and an analyzer module.

19. The method according to claim 1, wherein the purge gas is applied to the patterned photoresist layer at a first purge gas flow rate of 200 cc/s for 1 minute and then at a second purge gas flow rate of 100 cc/s for 10 minutes.

20. The method according to claim 10, wherein the gas stream is applied to the pattern at a first purge gas flow rate of 1000 cc/s for 1 minute and then at a second purge gas flow rate of 100 cc/s for 1 minute.

* * * * *